US007315269B2

(12) United States Patent
Schreier et al.

(10) Patent No.: US 7,315,269 B2
(45) Date of Patent: Jan. 1, 2008

(54) CONTINUOUS TIME ΔΣ MODULATOR SYSTEM WITH AUTOMATIC TIMING ADJUSTMENT

(75) Inventors: Richard E. Schreier, Andover, MA (US); Donald Paterson, Winchester, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/437,378

(22) Filed: May 19, 2006

(65) Prior Publication Data

US 2007/0035426 A1 Feb. 15, 2007

Related U.S. Application Data

(60) Provisional application No. 60/706,670, filed on Aug. 9, 2005, provisional application No. 60/706,671, filed on Aug. 9, 2005.

(51) Int. Cl.
*H03M 3/00* (2006.01)
(52) U.S. Cl. .................................... 341/143
(58) Field of Classification Search ................ 341/143, 341/118, 120, 144, 155
See application file for complete search history.

(56) References Cited

U.S. PATENT DOCUMENTS 5,039,989 A * 8/1991 Welland et al. ............. 341/143

6,512,473 B2 * 1/2003 Sasaki ........................ 341/159

OTHER PUBLICATIONS

F. Henkel and U. Langmann, "Excess Loop Delay Effects in Continuous-Time Quadrature Bandpass and Sigma-Delta Modulators", Proceedings of the 2003 International Symposium on Circuits and Systems, vol. 1, pp. 1029-1032, May 25-28, 2003.
S. Paton, et al., "A 70-mW 300-MHz CMOS Continuous-Time ΣΔ ADC wtih 15-MHz bandwidth and 11 bits of resolution" IEEE Journal of Solid-State Circuits, vol. 39, No. 7 pp. 1056-1063, Jul. 2004.
J. A. Cherry and W. M. Snelgrove, "Excess Loop Delay in Continuous-Time Delta-Sigma Modulators", IEEE Transactions on Circuits and Systems II, vol. 46, No. 4, pp. 376-389, Apr. 1999.

* cited by examiner

*Primary Examiner*—Brian Young
(74) *Attorney, Agent, or Firm*—Iandiorio & Teska

(57) ABSTRACT

A continuous time ΔΣ modulation system with automatic timing adjustment includes a loop filter having continuous time elements for receiving an input; and an ADC for sampling the output from the loop filter in response to an ADC clock; a DAC responsive to the output from the ADC for feeding back an input to the loop filter in response to a DAC clock; a timing measurement circuit for detecting a difference in the timing of the ADC sampling time and the DAC update time and a timing adjustment circuit responsive to the timing measurement circuit for adjusting the timing of at least one of the DAC and ADC clocks for aligning their respective update and sampling times.

12 Claims, 4 Drawing Sheets

CONTINUOUS TIME ΔΣ MODULATOR SYSTEM WITH AUTOMATIC TIMING ADJUSTMENT

RELATED APPLICATIONS

This application claims benefit of U.S. Provisional Application Ser. No. 60/706,670 filed Aug. 9, 2005 and 60/706,671 filed Aug. 9, 2005, both herein incorporated by this reference.

FIELD OF THE INVENTION

This invention relates to a continuous time ΔΣ modulator system with automatic timing adjustment.

BACKGROUND OF THE INVENTION

Delta-sigma (ΔΣ) ADCs are widely used for high-fidelity conversion of analog signals into digital form. ΔΣ ADCs can be broadly classified as either discrete-time or continuous-time. Discrete-time ΔΣ ADCs are more common, owing to the high degree of precision that is possible in their implementation. On the other hand, continuous-time ΔΣ ADCs have the advantages of inherent anti-aliasing and high speed. This invention addresses one of the practical problems that leads to non-ideal performance in a high-speed continuous-time ΔΣ ADC: imperfect synchronization or timing between the sampling operation and the DAC update time. In a continuous-time ΔΣ ADC the output of the analog loop filter is sampled, (optionally) processed in discrete-time with more analog circuitry, and then converted into digital form. The digital output is fed back via one or more DACs into the loop filter. In order for this system to behave as desired, the time when feedback is applied or updated via the DACs must be well-controlled with respect to the time when the output of the loop filter is sampled. For bandpass systems, a timing error as small as 10% of a clock period can be problematic, and with a clock rate in the hundreds of MHz this translates into sub-ns timing-accuracy requirements. Achieving such accuracy is difficult, and requires careful design and layout, and possibly several loops through the design-layout-simulate cycle. In one approach, timing uncertainty is included in the NTF (noise transfer function) selection process, but this approach is overly restrictive and is not guaranteed to provide satisfactory results in all cases. In another approach, means for adjustment of the timing was included in the circuit, but no method for determining the required adjustment was described. So, while the need for synchronizing sampling and updating is known, there is no disclosure of how to automatically do it.

SUMMARY OF THE INVENTION

It is therefore an object of this invention to provide a continuous time ΔΣ modulator system with automatic timing adjustment.

The invention results from the realization that a continuous time ΔΣ modulator system with automatic timing adjustment can be effected with a timing measurement circuit for detecting a difference in the timing of the ADC sampling time and the DAC update time; and a timing adjustment circuit, responsive to the timing measurement circuit, for adjusting the timing of at least one of the DAC and ADC clocks to align their respective update and sampling times.

The subject invention, however, in other embodiments, need not achieve all these objectives and the claims hereof should not be limited to structures or methods capable of achieving these objectives.

This invention features a continuous time ΔΣ modulation system with automatic timing adjustment including a loop filter having continuous time elements for receiving an input and an ADC for sampling the output from the loop filter in response to an ADC clock. There is a DAC responsive to the output from the ADC for feeding back an input to the loop filter in response to a DAC clock. A timing measurement circuit detects a difference in the timing of the ADC sampling time and the DAC update time and a timing adjustment circuit, responsive to the timing measurement circuit, adjusts the timing of at least one of the DAC and ADC clocks for aligning their respective update and sampling times.

In a preferred embodiment the loop filter may include discrete time elements as well as continuous time elements. The timing adjustment circuit may include a delay adjustment circuit responsive to a master clock and to the timing measurement circuit for adjusting the timing of the ADC clock. The timing adjustment circuit may include a coupling circuit for connecting the master clock to the DAC. The coupling circuit may include a fixed delay device. The timing measurement circuit may include a replica ADC, a replica DAC and a phase comparator for comparing the ADC sampling time with the DAC update time. The timing and measurement circuit may include an adjustment control circuit responsive to the phase comparator for generating a control signal to drive the timing adjustment circuit. The adjustment control circuit may include a digital logic circuit. The timing measurement circuit may include a power monitoring circuit for detecting the power in frequency regions indicative of DAC/ADC timing misalignment. The timing measurement circuit may include a comparator responsive to the power difference between the regions for indicating a misalignment of the DAC and ADC clocks. The timing measurement circuit may include an adjustment control circuit responsive to the comparator for generating a control signal to drive the timing adjustment circuit. The adjustment control circuit may include a digital logic circuit.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
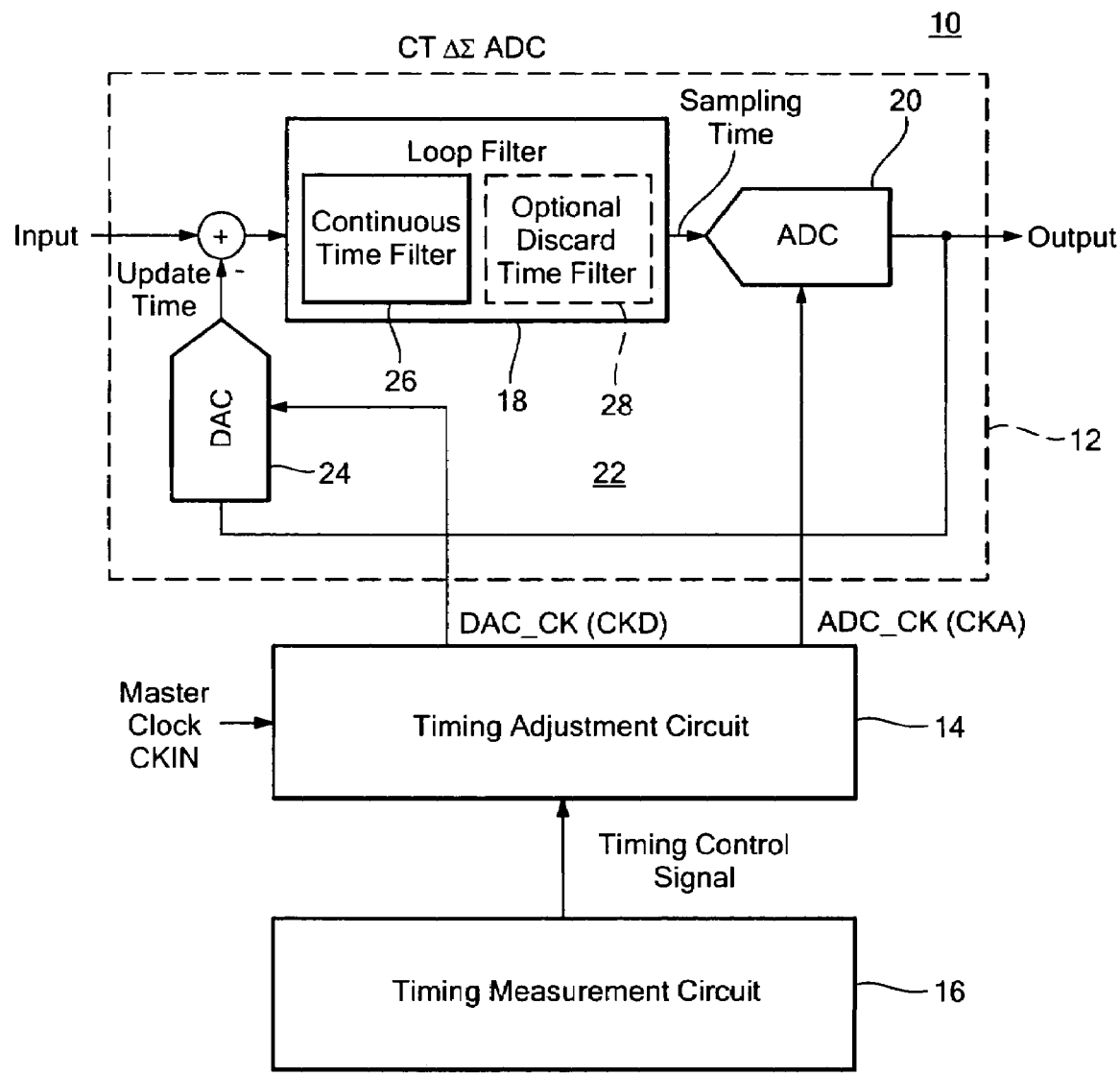
FIG. 1 is a schematic block diagram of a continuous time ΔΣ modulator system with automatic timing adjustment according to this invention.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

There is shown in FIG. 1 a continuous time ΔΣ modulator system with automatic timing adjustment 10 which includes ΔΣ modulator 12 timing adjustment circuit 14 and timing measurement circuit 16. ΔΣ modulator 12 typically includes a loop filter 18 which receives the input and delivers it to ADC 20 which provides the output. The output is also provided through feedback loop 22 including DAC 24 to the input of loop filter 18. Loop filter 18 includes a continuous time filter 26 and may or may not include discrete time filter elements 28 as well. Timing measurement circuit 16 determines any difference between the sampling time of ADC 20 and the update time of DAC 24. This results in a timing control signal being delivered from timing measurement circuit 16 to timing adjustment circuit 14. Timing adjustment circuit 14 receives master clock CKIN and in conjunction with the timing control signal adjusts at least one of the DAC clock CKD and the ADC clock CKA.

Figure 2:
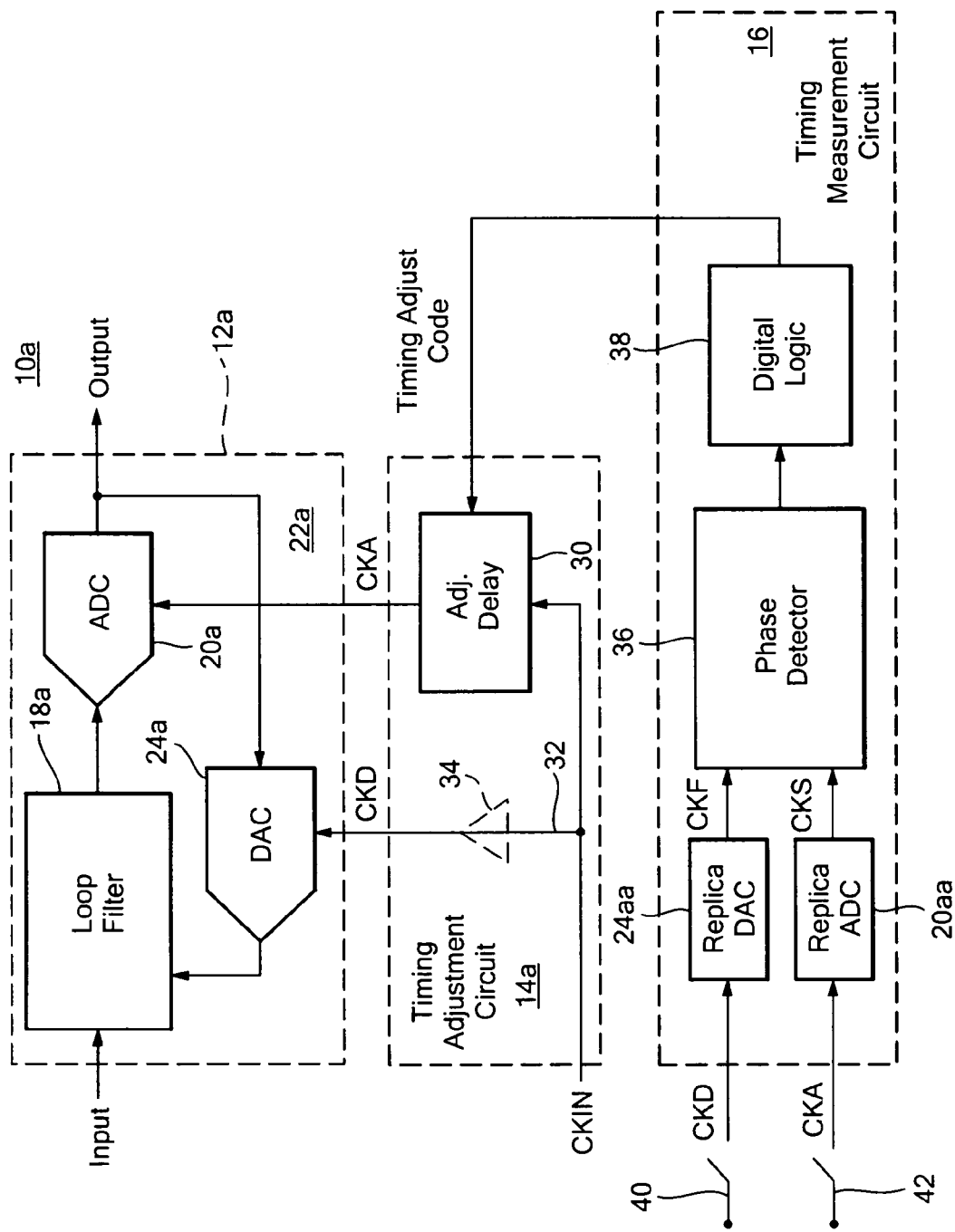
FIG. 2 is a more detailed schematic block diagram of one embodiment of the timing adjustment circuit and timing measurement circuit of FIG. 1.

In one embodiment, FIG. 2, timing adjustment circuit 14a includes an adjustment delay circuit 30 and a coupling circuit 32 which may be simply conductors, which conduct the master clock CKIN to DAC 24a as DAC clock CKD signal. Adjustment delay circuit 30 also responds to master clock CKIN and timing adjustment code from timing measurement circuit 16a to produce the adjusted ADC clock CKA so that the update time of DAC 24a and sample time of ADC 20a are moved to alignment. Coupling circuit 32 may include a fixed delay element 34 when for example the ADC delay is greater than the DAC delay. Adjustment delay circuit 30 may be a digital circuit such as a tapped inverter string and multiplexor, an analog circuit such as a voltage-controlled delay line or one which is both digital and analog.

Timing measurement circuit 16a includes replica DAC 24aa and replica ADC 20aa which as the name implies replicate the timing of the original ADC 20a and DAC 24a. Thus, when provided with the same clock signals CKD and CKA, replica DAC 24aa and replica ADC 20aa should provide signals whose alignment is similar to that of DAC 24a and ADC 20a, namely, signals CKF and CKS. These signals are submitted to a phase comparator, for example, phase detector 36 which detects any difference in the timing between the CKF and CKS signals. That difference is submitted to adjustment control circuit 38 which may, for example, be a digital logic circuit implementing a successive-approximation algorithm which generates the timing adjust code to advance or delay the adjustment made by adjustment delay circuit 30 to ADC clock CKA.

The example in FIG. 2 includes a straight path from the clock input CKIN to the CKD signal (or one with a fixed delay 34 as explained) and an adjustable or programmable delay line from the master clock CKIN to the adjustment delay circuit 30 from the master clock CKIN to the CKA signal. This arrangement is usually preferred to one which has means to alter the master clock CKIN to CKD timing since the jitter requirements for CKD are much more stringent then those of CKA. The example measurement means consists of two blocks, the replica DAC 24aa and the replica ADC 20aa which produce the CKF and CKS signals that approximately track the DAC 24a and ADC 20a, respectively. The digital logic or other adjustment control circuit 38 may be activated during a calibration cycle and then the timing adjust code, delivered to adjustment delay circuit 30, may be held fixed until the next calibration cycle. If a continuous background adjustment of the timing is necessary this may be accomplished by periodically/occasionally dithering the timing adjust code between the two adjacent codes which correspond to CKF leading CKS and vice versa, CKS leading CKF as suggested by the presence of switches 40, 42, in FIG. 2. If CKF is found to lead CKS for both codes, then the codes need to be decremented so that CKS occurs earlier. If CKF lags CKS for both codes, the codes need to be incremented. In essence, this mimics the operation of a delay-locked loop (DLL). Indeed a typical DLL including an analog-controlled delay line could be used to accomplish the goal of controlling the timing of the sampling and feedback advance provided the DLL were fed with the CKF and CKS signals or their equivalents.

Figure 3:
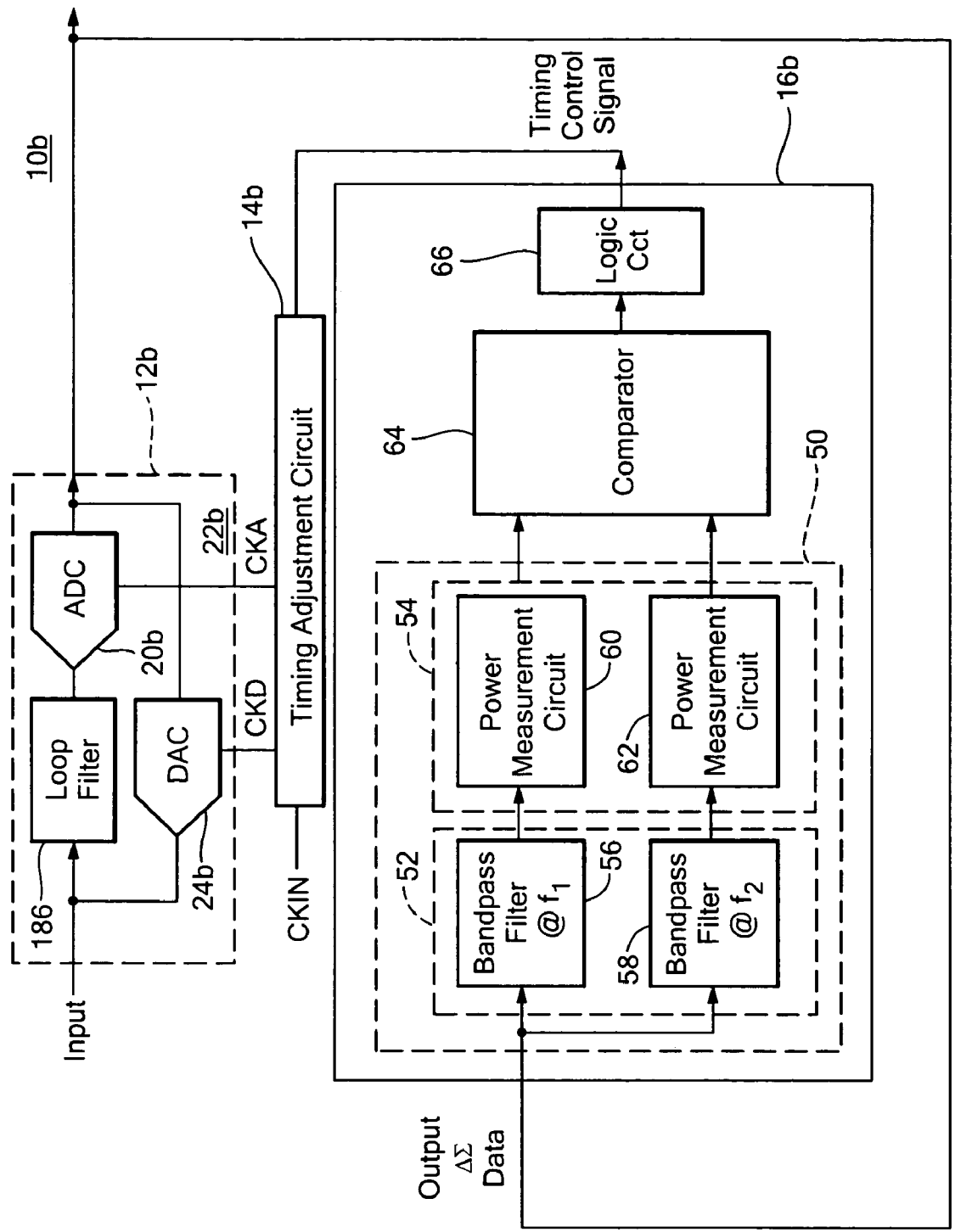
FIG. 3 is a more detailed schematic block diagram of another embodiment of the timing adjustment circuit and timing measurement circuit of FIG. 1.

An alternative embodiment is shown in FIG. 3 which eliminates the analog components of the measurement circuit, namely, the replica DAC 24aa, replica ADC 20aa and the phase comparator 36 by exploiting the predictable effect of incorrect timing on a ΔΣ modulator's output spectrum. In FIG. 3, timing measurement circuit 16b includes a power monitoring circuit 50 which may include band pass filter 52 and a power measurement circuit 54. Band pass filter 52 may include a band pass filter 56 at frequency $f_1$, and a second band pass filter 58 at frequency $f_2$. Each filter 56 and 58 is serviced by a power measurement circuit 60, 62, respectively. The power outputs of power measurement circuit 60 and 62 are compared in comparator 64 and the difference is converted by logic circuit 66 into a timing control signal for driving timing adjustment circuit 14b.

Figure 4:
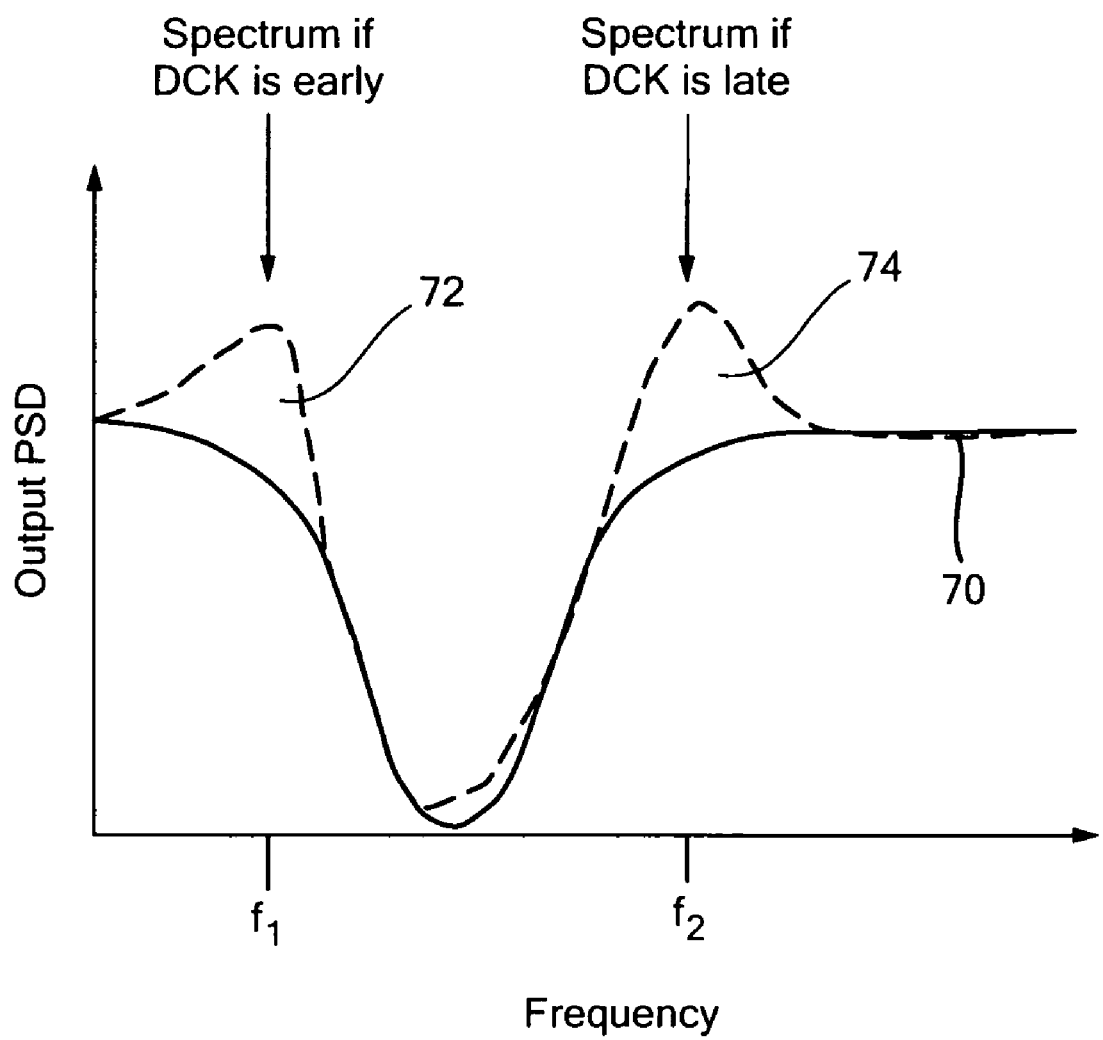
FIG. 4 is a representation of the frequency spectrum of the ΔΣ output showing increased noise regions when DAC update is early and late relative to ADC sampling.

The output spectrum 70 of the ΔΣ modulator is shown in FIG. 4. System analysis typically shows that if CKD occurs early then there will be a peak in the output spectrum in the region 72 of frequency $f_1$, whereas if the CKD occurs late then there will be a peak in the region 74 of frequency $f_2$. By comparing the spectral energy or power near $f_1$, to that near $f_2$ a decision is made to advance the timing, delay it, or leave it as is. As before, the timing adjustment may be done on a one-time, periodic, on-demand, or continuous basis. Also, the separate dedicated filters shown in FIG. 3 can be replaced by a single filter which measures the power in the vicinity of $f_1$, and then does likewise for $f_2$. The two power measurements are then compared and the decision to advance the timing, delay it, or leave it as-is, can be made as before.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A continuous time ΔΣ modulator system with automatic timing adjustment comprising:
    a loop filter including continuous time elements for receiving an input;
    an ADC for sampling the output from said loop filter in response to an ADC clock;
    a DAC responsive to the output from said ADC for feeding back an input to said loop filter in response to a DAC clock;
    a timing measurement circuit for detecting a difference in the timing of the ADC sampling time and the DAC update time; and
    a timing adjustment circuit, responsive to said timing measurement circuit, for adjusting the timing of at least one of said DAC and ADC clocks for aligning their respective update and sampling times.

2. The continuous time ΔΣ modulator system with automatic timing adjustment of claim 1 in which said loop filter also includes discrete time elements.

3. The continuous time ΔΣ modulator system with automatic timing adjustment of claim 1 in which said timing adjustment circuit includes a delay adjustment circuit responsive to a master clock and to said timing measurement circuit for adjusting the timing of the ADC clock.

4. The continuous time ΔΣ modulator system with automatic timing adjustment of claim 3 in which said timing adjustment circuit includes a coupling circuit for connecting said master clock to said DAC.

5. The continuous time ΔΣ modulator system with automatic timing adjustment of claim 4 in which said coupling circuit includes a fixed delay device.

6. The continuous time ΔΣ modulator system with automatic timing adjustment of claim 1 in which said timing measurement circuit includes a replica ADC, a replica DAC and a phase comparator for comparing the ADC sampling time with the DAC update time.

7. The continuous time ΔΣ modulator system with automatic timing adjustment of claim 6 in which said timing measurement circuit includes an adjustment control circuit responsive to said phase comparator for generating a control signal to drive said timing adjustment circuit.

8. The continuous time ΔΣ modulator system with automatic timing adjustment of claim 7 in which said adjustment control circuit includes a digital logic circuit.

9. The continuous time ΔΣ modulator system with automatic timing adjustment of claim 1 in which said timing measurement circuit includes a power monitoring circuit for detecting the power in frequency regions indicative of DAC/ADC timing misalignment.

10. The continuous time ΔΣ modulator system with automatic timing adjustment of claim 9 in which said timing measurement circuit includes a comparator responsive to the power difference between said regions for indicating a misalignment of said DAC and ADC clocks.

11. The continuous time ΔΣ modulator system with automatic timing adjustment of claim 10 in which said timing measurement circuit includes an adjustment control circuit responsive to said comparator for generating a control signal to drive said timing adjustment circuit.

12. The continuous time ΔΣ modulator system with automatic timing adjustment of claim 11 in which said adjustment control circuit includes a digital logic circuit.

* * * * *